(12) United States Patent
Hayama et al.

(10) Patent No.: US 7,270,594 B2
(45) Date of Patent: *Sep. 18, 2007

(54) POLISHING APPARATUS

(75) Inventors: Takuji Hayama, Tokyo (JP);
Masafumi Inoue, Tokyo (JP);
Kunihiko Sakurai, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/602,336

(22) Filed: Nov. 21, 2006

(65) Prior Publication Data

US 2007/0087663 A1   Apr. 19, 2007

Related U.S. Application Data

(62) Division of application No. 10/530,277, filed as application No. PCT/JP03/14057 on Nov. 4, 2003, now Pat. No. 7,156,719.

(30) Foreign Application Priority Data

Nov. 5, 2002   (JP) ............................. 2002-320725

(51) Int. Cl.
*B24B 49/00*   (2006.01)
(52) U.S. Cl. ........................................... 451/8; 451/11
(58) Field of Classification Search .................... 451/5, 451/6, 8–11, 41, 285–289
See application file for complete search history.

(56) References Cited

U.S. PATENT DOCUMENTS 6,695,687 B2 *   2/2004   Hollatz et al. .............. 451/288

7,156,719 B2 *   1/2007   Hayama et al. ................ 451/8

FOREIGN PATENT DOCUMENTS

| EP | 1080841 A2 | 3/2001 |
|----|------------|--------|
| JP | 2000-167767 | 6/2000 |
| JP | 2001-129756 | 5/2001 |

* cited by examiner

*Primary Examiner*—Dung Van Nguyen
(74) *Attorney, Agent, or Firm*—Wenderoth, Lind & Ponack, L.L.P.

(57) ABSTRACT

A polishing apparatus has a polishing table (12) with a polishing surface (10) attached thereon, and a top ring (20) for pressing a workpiece (W) against the polishing surface (10). The top ring (20) has a housing (40) and a retainer ring (44) vertically movable in the housing (40) for holding an outer circumferential edge of the workpiece (W). The polishing apparatus includes a vertically moving mechanism operable to vertically move the top ring (20), a bracket (28) vertically movable together with the top ring (20), a stopper (32) adjustable in vertical position to prevent downward movement of the bracket (28), and a sensor (36) for detecting a distance between the stopper (32) and the bracket (28). The polishing apparatus also includes a control unit (34) operable to adjust the stopper (32) in vertical position when the retainer ring (44) is brought into contact with the polishing surface (10) while a lower surface of the housing (40) of the top ring (20) is located at a predetermined height from the polishing surface (10) so that the distance between the stopper (32) and the bracket (28) is equal to a difference between a height of the lower surface of the housing (40) from the polishing surface (10) at the time of polishing and the predetermined height.

5 Claims, 6 Drawing Sheets

POLISHING APPARATUS

This application is a divisional of U.S. application Ser. No. 10/530,277, filed Sep. 22, 2005 now U.S. Pat. No. 7,156,719, which was the National Stage of International Application No. PCT/JP2003/014057, filed Nov. 4, 2003.

TECHNICAL FIELD

The present invention relates to a polishing apparatus, and more particularly to a polishing apparatus for polishing a workpiece such as a semiconductor wafer to a flat mirror finish. The present invention also relates to a method of adjusting such a polishing apparatus.

BACKGROUND ART

As semiconductor devices have become more highly integrated in recent years, circuit interconnections have become finer and distances between those circuit interconnections have become smaller. In the case of photolithography, which can form interconnections that are at most 0.5 µm wide, it is required that surfaces on which pattern images are to be focused by a stepper should be as flat as possible because the depth of focus of an optical system is relatively small. In order to planarize such a semiconductor wafer, there has been used a polishing apparatus for performing chemical mechanical polishing (CMP).

This type of polishing apparatus comprises a polishing table having a polishing pad (polishing cloth) attached thereon, and a top ring for holding a workpiece to be polished, such as a semiconductor wafer, in a manner such that a surface to be polished faces the polishing table. The polishing pad has an upper surface serving as a polishing surface. In this polishing apparatus, the polishing table and the top ring are independently rotated, and, while an abrasive liquid (slurry) is being supplied onto the polishing pad, a workpiece is pressed against the polishing pad on the polishing table at a predetermined pressure by the top ring. Thus, a surface of the workpiece is polished to a flat mirror finish.

When such a polishing apparatus is used to polish a workpiece, in order to achieve a desired polishing performance, it is required to adjust vertical positions of components in the top ring at the time of polishing. Conventionally, block gauges have been used to adjust vertical positions of the components in the top ring. Specifically, block gauges having a predetermined thickness are interposed between the polishing surface and the components, and then the top ring is lowered until the top ring is brought into contact with the block gauges on the polishing surface. Thus, vertical positions of the components at the time of polishing are adjusted by the block gauges.

However, according to the conventional method, it is necessary to manually adjust the vertical positions of the components with the block gauges. Therefore, it troublesome and time-consuming to adjust the vertical positions of components in a top ring according to the conventional method. Further, with regard to components which have not been adjusted in vertical position with block gauges, once such components are worn, the vertical positions of the components cannot be readjusted according to the conventional method.

DISCLOSURE OF THE INVENTION

The present invention has been made in view of the above drawbacks. It is, therefore, an object of the present invention to provide a polishing apparatus which can automatically adjust positions of components in a top ring in a short period of time and can prevent abrasion of a polishing surface.

Another object of the present invention is to provide a method of adjusting a polishing apparatus which can automatically adjust positions of components in a top ring in a short period of time and can prevent abrasion of a polishing surface.

According to a first aspect of the present invention, there is provided a polishing apparatus having a polishing table with a polishing surface attached thereon and a top ring for pressing a workpiece against the polishing surface. The top ring has a housing and a retainer ring vertically movable in the housing for holding an outer circumferential edge of the workpiece. The polishing apparatus includes a vertically moving mechanism operable to vertically move the top ring, a bracket vertically movable together with the top ring, a stopper adjustable in vertical position to prevent downward movement of the bracket, and a sensor for detecting a distance between the stopper and the bracket. The polishing apparatus also includes a control unit operable to adjust the stopper in vertical position when the retainer ring is brought into contact with the polishing surface while a lower surface of the housing of the top ring is located at a predetermined height from the polishing surface so that the distance between the stopper and the bracket is equal to a difference between a height of the lower surface of the housing from the polishing surface at the time of polishing and the predetermined height. The predetermined height should preferably be defined as a height of the housing of the top ring when the housing is moved to an uppermost position with respect to the retainer ring.

With the above arrangement, even if the polishing surface, e.g., a polishing pad, becomes thinner, the vertical position of the stopper can automatically be readjusted so that the housing of the top ring is located at a desired position to have a desired bridge height. Thus, it is possible to automatically adjust the bridge height in a short period of time. With the conventional method, if an expendable component in the top ring, e.g., the retainer ring, is worn, then the bridge height cannot be readjusted. According to the present invention, even if such an expendable component in the top ring is worn, the bridge height can be readjusted in the above manner.

According to a second aspect of the present invention, there is provided a polishing apparatus having a polishing table with a polishing surface attached thereon and a top ring for pressing a workpiece against the polishing surface. The top ring has a retainer ring for holding an outer circumferential edge of the workpiece, and a vertically movable chucking plate to hold the workpiece on a lower surface thereof. The polishing apparatus includes a vertically moving mechanism operable to vertically move the top ring, a bracket vertically movable together with the top ring, a stopper adjustable in vertical position to prevent downward movement of the bracket, and a sensor for detecting a distance between the stopper and the bracket. The polishing apparatus also includes a control unit operable to adjust the stopper in vertical position when the workpiece held on the lower surface of the vertically movable chucking plate is brought into contact with the polishing surface while a lower surface of the retainer ring of the top ring is located at a predetermined height from the polishing surface so that the distance between the stopper and the bracket is equal to a difference between a height of the lower surface of the retainer ring from the polishing surface at the time of polishing and the predetermined height. The predetermined height should preferably be defined as a height of the retainer ring of the top ring when the retainer ring is moved to an uppermost position with respect to the chucking plate.

With the above arrangement, it is possible to automatically adjust the vertical position of the stopper so that the retainer ring of the top ring is located at a desired position. The workpiece can be polished in a state in which the retainer ring is above the polishing surface to prevent abrasion of the polishing surface by the retainer ring.

According to a third aspect of the present invention, there is provided a polishing apparatus having a polishing table with a polishing surface attached thereon and a top ring for pressing a workpiece against the polishing surface. The polishing apparatus includes a vertically moving mechanism operable to vertically move the top ring, a bracket vertically movable together with the top ring, and a stopper adjustable in vertical position to prevent downward movement of the bracket. The polishing apparatus also includes a control unit operable to adjust the stopper in vertical position.

According to a fourth aspect of the present invention, there is provided a polishing apparatus having a polishing table with a polishing surface attached thereon and a top ring for pressing a workpiece against the polishing surface. The top ring has a housing and a retainer ring vertically movable in the housing for holding an outer circumferential edge of the workpiece. The polishing apparatus includes a vertically moving mechanism operable to vertically move the top ring, a bracket vertically movable together with the top ring, a stopper adjustable in vertical position to prevent downward movement of the bracket, and a sensor for detecting a distance between the stopper and the bracket. The polishing apparatus also includes a control unit operable to adjust the stopper in vertical position based on a distance signal from the sensor.

According to a fifth aspect of the present invention, there is provided a method of adjusting a polishing apparatus. The polishing apparatus has a polishing table having a polishing surface attached thereon, and a top ring for pressing a workpiece against the polishing surface. The top ring has a housing, and a retainer ring vertically movable in the housing for holding an outer circumferential edge of the workpiece. The retainer ring is brought into contact with the polishing surface while a lower surface of the housing of the top ring is located at a predetermined height from the polishing surface. A distance between the stopper and the bracket is detected. The stopper is adjusted in vertical position so that the distance between the stopper and the bracket is equal to a difference between a height of the lower surface of the housing from the polishing surface at the time of polishing and the predetermined height. The predetermined height should preferably be defined as a height of the housing of the top ring when the housing is moved to an uppermost position with respect to the retainer ring.

According to a sixth aspect of the present invention, there is provided a method of adjusting a polishing apparatus. The polishing apparatus has a polishing table having a polishing surface attached thereon, and a top ring for pressing a workpiece against the polishing surface. The top ring has a retainer ring for holding an outer circumferential edge of the workpiece and a vertically movable chucking plate to hold the workpiece on a lower surface thereof. The workpiece held on the lower surface of the vertically movable chucking plate is brought into contact with the polishing surface while a lower surface of the retainer ring of the top ring is located at a predetermined height from the polishing surface. A distance between the stopper and the bracket is detected. The stopper is adjusted in vertical position so that the distance between the stopper and the bracket is equal to a difference between a height of the lower surface of the retainer ring from the polishing surface at the time of polishing and the predetermined height. The predetermined height should preferably be defined as a height of the retainer ring of the top ring when the retainer ring is moved to an uppermost position with respect to the chucking plate.

The above and other objects, features, and advantages of the present invention will be apparent from the following description when taken in conjunction with the accompanying drawings which illustrate preferred embodiments of the present invention by way of example.

BEST MODE FOR CARRYING OUT THE INVENTION

Figure 1:
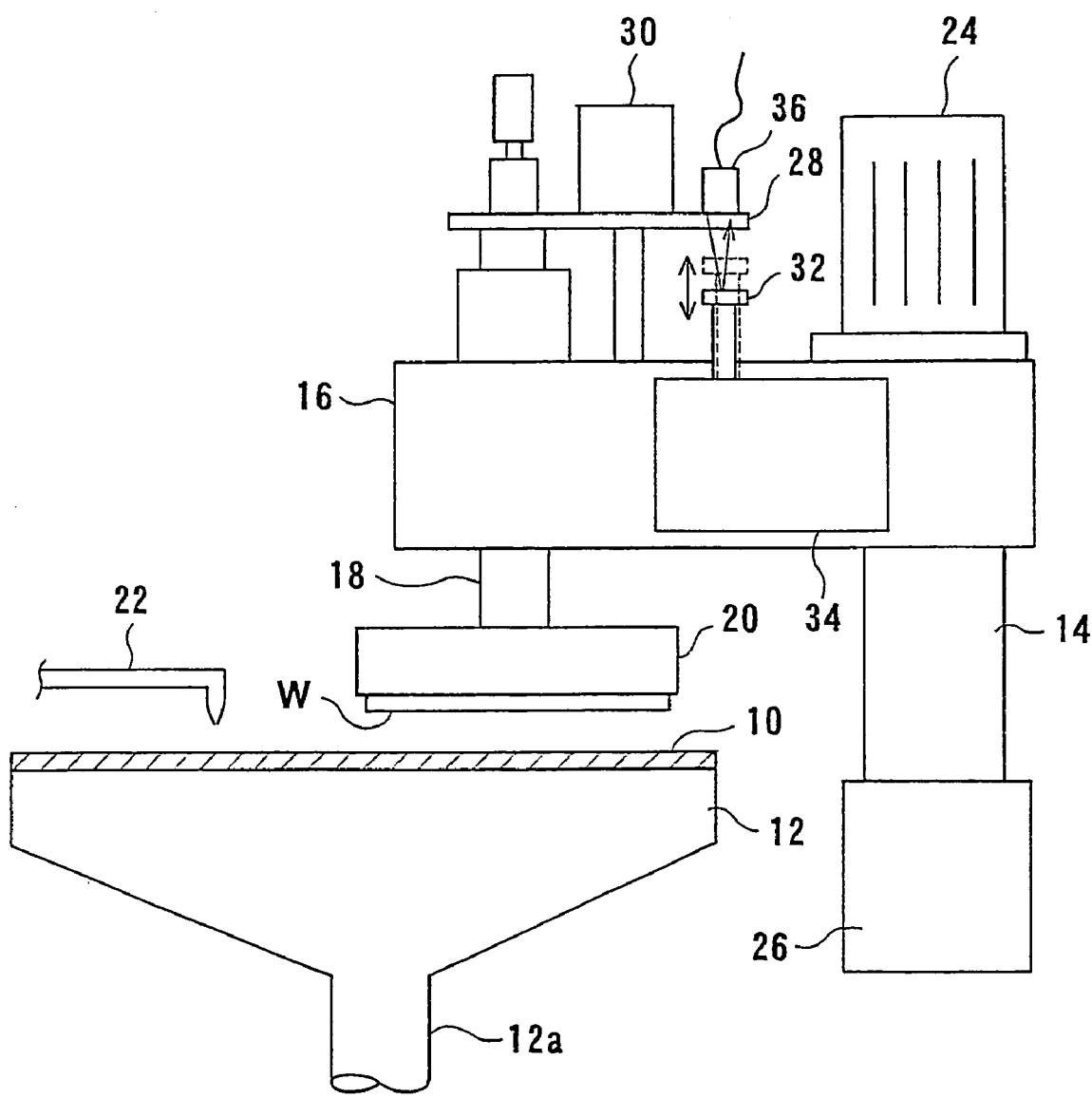
FIG. 1 is a schematic view showing a polishing apparatus according to a first embodiment of the present invention.

A polishing apparatus according to embodiments of the present invention will be described below with reference to FIGS. 1 through 6. In FIGS. 1 through 6, like or corresponding components are designated by the same reference numerals and will not be described repetitively.

FIG. 1 is a schematic view showing a polishing apparatus according to a first embodiment of the present invention. As shown in FIG. 1, the polishing apparatus has a polishing table 12 having a polishing pad 10 attached thereon, a support shaft 14, a top ring head 16 connected to an upper end of the support shaft 14, a top ring shaft 18 attached to a free end of the top ring head 16, and a top ring 20 coupled to the top ring shaft 18. For example, the top ring 20 is in the form of a circular plate. The polishing table 12 is coupled to a motor (not shown) disposed below the polishing table 12 via a table shaft 12a. Thus, when the motor is actuated, the polishing table 12 is rotated about the table shaft 12a. The polishing apparatus has a polishing liquid supply nozzle 22 disposed above the polishing table 12. The polishing liquid supply nozzle 22 supplies a polishing liquid to the polishing pad 10 on the polishing table 12.

The top ring head 16 has a rotation motor 24 mounted on an upper surface of the top ring head 16. The rotation motor 24 has a shaft coupled to the top ring shaft 18 via a belt (not shown) disposed in the top ring head 16. Thus, when the rotation motor 24 is actuated, the top ring shaft 18 is rotated via the belt, so that the top ring 20 is rotated about the top ring shaft 18. The top ring head 16 is mounted on the upper end of the support shaft 14 so as to pivot on the support shaft 14. The support shaft 14 has a pivotal movement motor 26 coupled to a lower end of the support shaft 14. Thus, when the pivotal movement motor 26 is actuated, the top ring head 16 pivots on a horizontal plane on the support shaft 14.

The top ring shaft 18 is vertically movable so as to lift and lower the top ring 20. The top ring shaft 18 has a bracket 28 provided at an upper portion of the top ring shaft 18. The bracket 28 is vertically moved together with the top ring shaft 18. The top ring head 16 has an air cylinder 30 connected to a portion of the bracket 28. The air cylinder 30 serves as a vertically moving mechanism operable to vertically move the top ring shaft 18 and the top ring 20 via the bracket 28 with respect to the top ring head 16. Thus, the top ring 20 is vertically moved by actuation of the air cylinder 30.

The top ring head 16 has a control unit 34 disposed in the top ring head 16, and a stopper 32 connected to the control unit 34. The stopper 32 is arranged so that the vertical position of the stopper 32 is adjustable by the control unit 34. The control unit 34 controls the vertical position of the stopper 32. When the bracket 28 is brought into contact with an upper surface of the stopper 32, the stopper 32 prevents further downward movement of the top ring 20. The bracket 28 has a sensor 36 for detecting a distance between an upper surface of the stopper 32 and the bracket 28.

Figure 2:
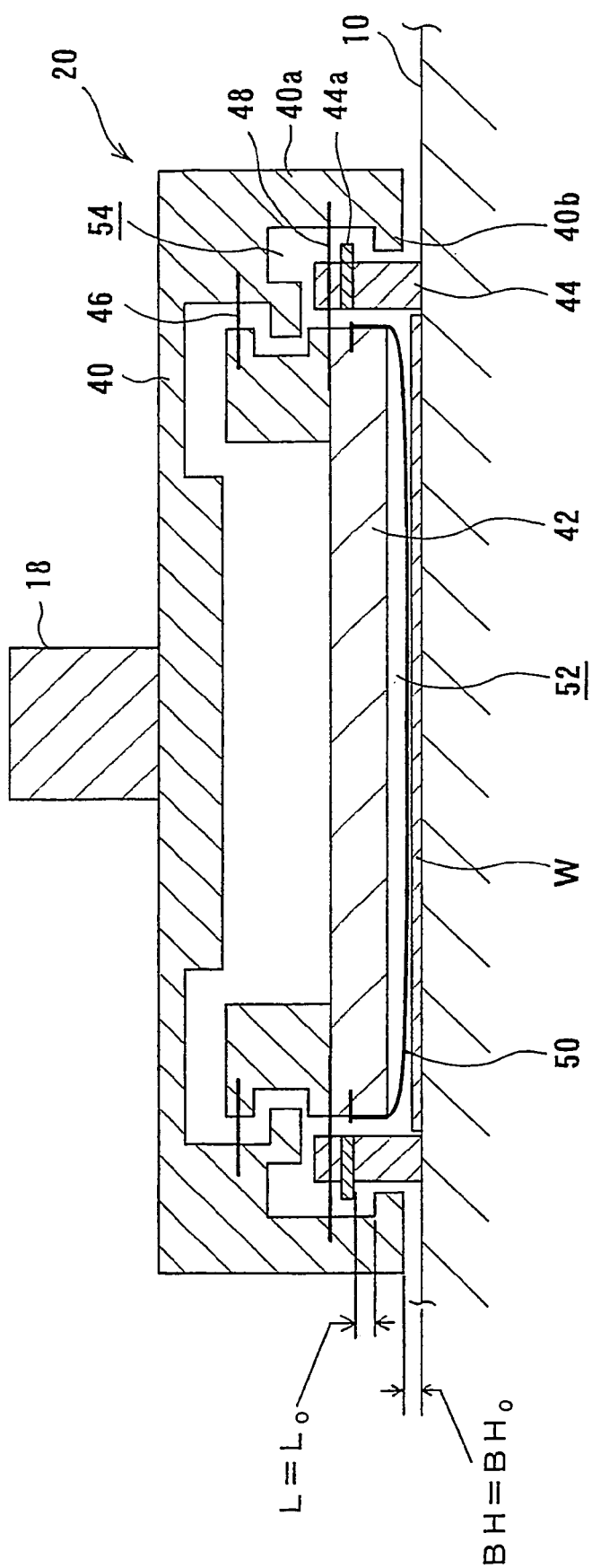
FIG. 2 is a schematic cross-sectional view showing a top ring of the polishing apparatus shown in FIG. 1.

FIG. 2 is a schematic cross-sectional view showing the top ring 20 of FIG. 1. The top ring 20 serves to press a workpiece such as a wafer W against the polishing pad 10. As shown in FIG. 2, the top ring 20 has a housing 40 connected to a lower end of the top ring shaft 18, a vertically movable sub-carrier 42 housed in the housing 40, and a retainer ring 44 disposed at a peripheral portion of the wafer W. The retainer ring 44 serves to hold an outer circumferential edge of the wafer W. The retainer ring 44 is located between a peripheral portion 40*a* of the housing 40 and the sub-carrier 42.

The sub-carrier 42 is attached to the housing 40 by an upper diaphragm 46 and a lower diaphragm 48. The diaphragms 46 and 48 are made of an elastic membrane. Thus, the sub-carrier 42 is arranged so as to be vertically movable with respect to the housing 40 via the diaphragms 46 and 48. The retainer ring 44 has an upper portion connected to the lower diaphragm 48 and is vertically movable with respect to the housing 40 via the lower diaphragm 48.

The sub-carrier 42 holds an elastic membrane 50 on a lower surface of the sub-carrier 42. The elastic membrane 50 defines a chamber 52 between the elastic membrane 50 and the lower surface of the sub-carrier 42. The chamber 52 can be supplied with a fluid having a predetermined pressure. By adjusting the pressure of the fluid supplied to the chamber 52, it is possible to adjust a force to press the wafer W against the polishing pad 10. The diaphragms 46 and 48, the sub-carrier 42, and the peripheral portion 40*a* of the housing 40 define a chamber 54, which can be supplied with a fluid having a predetermined pressure. By adjusting the pressure of the fluid supplied to the chamber 54, it is possible to adjust the pressure in the chamber 54.

The peripheral portion 40*a* of the housing 40 has a projection 40*b* extending radially inward. The retainer ring 44 has a projection 44*a* extending radially outward. When the projection 44*a* of the retainer ring 44 is brought into contact with an upper surface of the projection 40*b* of the housing 40, the projection 40*b* of the housing 40 prevents further downward movement of the retainer ring 44.

With the polishing apparatus thus constructed, the wafer W is polished as follows. The air cylinder 30 is actuated to lower the top ring 20 so that the bracket 28 is brought into contact with the stopper 32. Thus, the top ring 20 is lowered to a predetermined position. This position is determined in advance such that a distance BH (see FIG. 2) between an upper surface of the polishing pad 10 and a lower surface of the peripheral portion 40*a* of the housing 40 is maintained at a desired value $BH_0$. Such a distance BH is hereinafter referred to as a bridge height.

As the polishing pad 10 becomes thinner due to abrasion according to a repeated polishing process, the retainer ring 44 and the sub-carrier 42 may project downward by a distance corresponding to the reduced amount of the thickness of the polishing pad 10 if the top ring 20 remains located at the predetermined position described above. In such a case, the diaphragms 46 and 48 are changed in shape. The shapes of the diaphragms 46 and 48 have an influence on the polishing performance of the wafer and are thus an important factor in the polishing process. Therefore, the diaphragms 46 and 48 are required to maintain a constant shape during the polishing process.

FIG. 2 shows an ideal state of the top ring 20 during the polishing process. As shown in FIG. 2, the projection 44*a* of the retainer ring 44 and the upper surface of the projection 40*b* of the housing 40 have a clearance L therebetween. Once a desired bridge height is determined, a desired value can automatically be determined for the clearance L in connection with the dimensions of the retainer ring 44 and the projection 40*b* of the housing 40. According to the present embodiment, the clearance L is adjusted to be a desired value $L_0$ to maintain a desired bridge height $BH_0$ in order to maintain the shapes of the diaphragms 46 and 48. The desired value $L_0$ should preferably be determined such that a sum of a reaction force of the diaphragm 48 as an elastic membrane and a force applied to the diaphragm 48 by the fluid supplied to the chamber 54 during polishing can achieve a desired polishing performance. In the present embodiment, the clearance L and the bridge height BH is adjusted as follows.

First, a desired clearance $L_0$ between the projection 44*a* of the retainer ring 44 and the upper surface of the projection 40*b* of the housing 40 is calculated from a desired bridge height $BH_0$ in advance. Then, the stopper 32 is adjusted in its vertical position such that the clearance L between the projection 44*a* of the retainer ring 44 and the upper surface of the projection 40*b* of the housing 40 becomes the (precalculated) desired clearance $L_0$.

Figure 3:
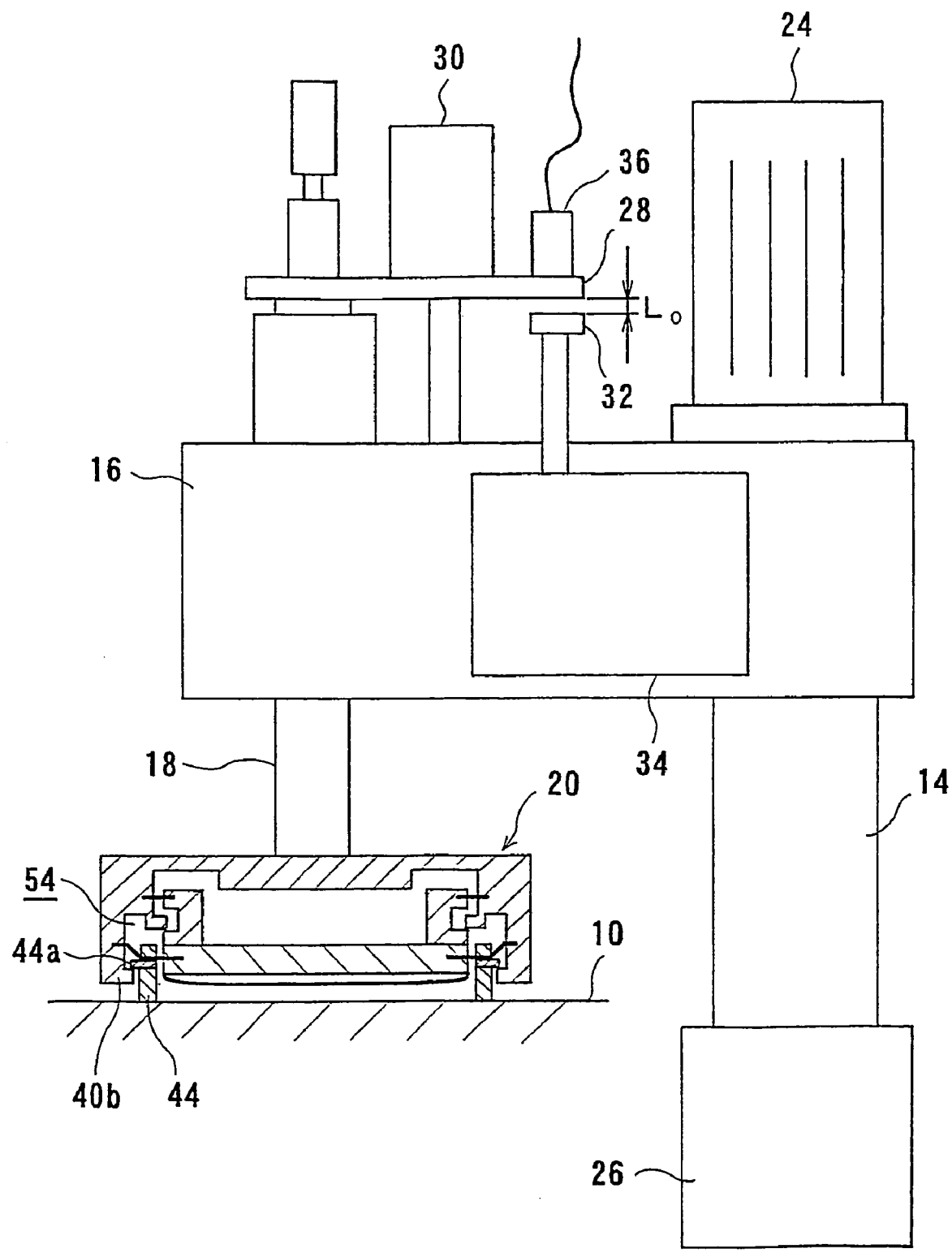
FIG. 3 is a schematic view showing a state of the polishing apparatus shown in FIG. 1 when a stopper is adjusted in its vertical position.

FIG. 3 is a schematic view showing a state of the polishing apparatus when the stopper 32 is adjusted in its vertical position. When the stopper 32 is adjusted in vertical position, a pressurized fluid is supplied to the chamber 54 located above the retainer ring 44 to move the retainer ring 44 downward so that the projection 44*a* of the retainer ring 44 is brought into contact with the upper surface of the projection 40*b* of the housing 40. In that state, the top ring 20 is lowered without actuation of the air cylinder 30 to bring the lower surface of the retainer ring 44 into the upper surface of the polishing pad 10. Since the top ring 20 is not pressed by the air cylinder 30, the projection 44*a* of the retainer ring 44 remains held in contact with the upper surface of the projection 40*b* of the housing 40, as shown in FIG. 3. In that state, the housing 40 of the top ring 20 is at an uppermost position with respect to the retainer ring 44.

Then, the control unit 34 moves the stopper 32 and adjusts the vertical position of the stopper 32 based on a distance signal outputted from the sensor 36 so that the distance between the stopper 32 and the bracket 28, which is detected by the sensor 36, is equal to the desired clearance $L_0$, as shown in FIG. 3. The adjusted position of the stopper 32 determines a vertical position of the top ring 20 at the time of polishing. The adjusted position of the stopper 32 is stored in a storage device within the control unit 34.

Figure 4:
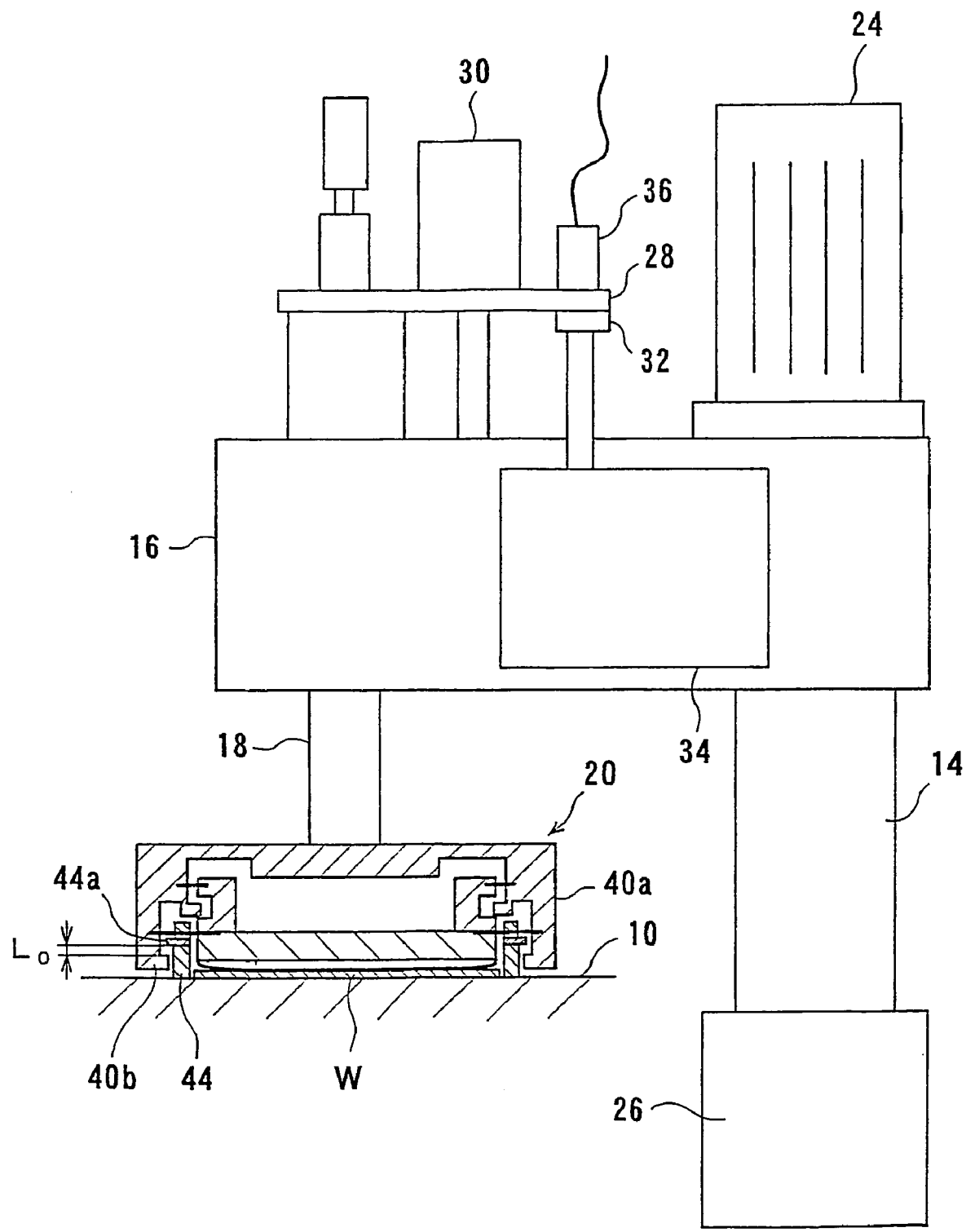
FIG. 4 is a schematic view showing a state of the polishing apparatus shown in FIG. 1 when a wafer is polished.
Figure 5:
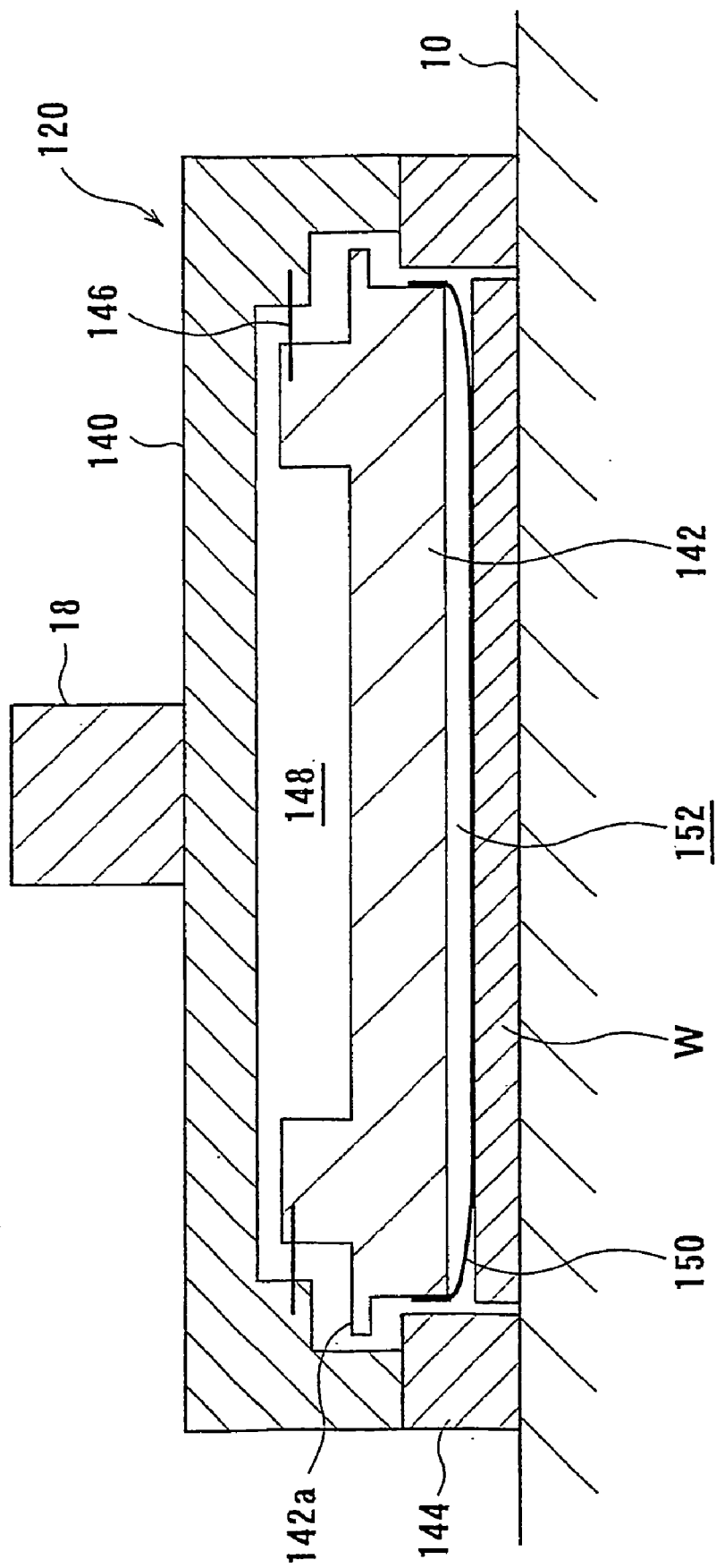
FIG. 5 is a schematic cross-sectional view showing a top ring according to a second embodiment of the present invention.

FIG. 4 is a schematic view showing a state of the polishing apparatus when a wafer is polished. As shown in FIG. 4, when a wafer is polished, the air cylinder 30 is actuated to lower the top ring 20 until the bracket 28 is brought into contact with the upper surface of the stopper 32. At that time, while the retainer ring 44 is brought into contact with the polishing pad 10, the top ring 20 is moved downward by the distance $L_0$ from the state shown in FIG. 3. Thus, a desired clearance $L_0$ can be formed between the projection 44a of the retainer ring 44 and the upper surface of the projection 40b of the housing 40. Accordingly, the lower surface of the peripheral portion 40a of the housing 40 is located at the desired bridge height $BH_0$.

As described above, in the present embodiment, the stopper 32 is adjusted in its vertical position so that the distance between the stopper 32 and the bracket 28 in the state shown in FIG. 3 is equal to the difference between the height ($BH_0$) of the lower surface of the housing 40 from the polishing pad 10 at the time of polishing and the height of the lower surface of the housing 40 shown in FIG. 3, i.e., the distance $L_0$. With this arrangement, even if the polishing pad 10 becomes thinner, the position of the stopper 32 can automatically be readjusted so that the housing 40 of the top ring 20 is located at a desired position to have a desired bridge height. Therefore, it is possible to automatically adjust the bridge height in a short period of time. With the conventional method, if an expendable component in the top ring 20, e.g., the retainer ring 44, is worn, then the bridge height cannot be readjusted. According to the present invention, even if such an expendable component in the top ring 20 is worn, the bridge height can be readjusted in the above manner.

The present invention is not limited to the top ring described above and is applicable to other types of top rings. For example, the present invention is applicable to a top ring 120 shown in FIG. 5. The top ring 120 shown in FIG. 5 has a housing 140 connected to a lower end of a top ring shaft 18, a vertically movable chucking plate 142 housed in the housing 140, and a retainer ring 144 attached to a lower peripheral end of the housing 140.

The chucking plate 142 is attached to the housing 140 by a diaphragm 146 made of an elastic membrane. The chucking plate 142 is vertically movable with respect to the housing 140 and the retainer ring 144. The diaphragm 146 defines a chamber 148 between the housing 140 and the chucking plate 142. The chamber 148 can be supplied with a fluid having a predetermined pressure. By adjusting the pressure of the fluid supplied to the chamber 148, it is possible to move the chucking plate 142 vertically with respect to the housing 140 and the retainer ring 144.

The chucking plate 142 holds an elastic membrane 150 on a lower surface of the chucking plate 142. The elastic membrane 150 defines a chamber 152 between the elastic membrane 150 and the lower surface of the chucking plate 142. The chamber 152 can be supplied with a fluid having a predetermined pressure. By adjusting the pressure of the fluid supplied to the chamber 152, it is possible to adjust a force to press the wafer W against the polishing pad 10.

The chucking plate 142 has a projection 142a extending radially outward. When the projection 142a of the chucking plate 142 is brought into contact with an upper surface of the retainer ring 144, the retainer ring 144 prevents further downward movement of the chucking plate 142. The housing 140 may have a peripheral portion extending radially inward to prevent further downward movement of the chucking plate 142.

When the stopper 32 is adjusted in vertical position, a pressurized fluid is supplied to the chamber 148 located above the chucking plate 142 to move the chucking plate 142 downward so that the projection 142a of the chucking plate 142 is brought into contact with the upper surface of the retainer ring 144. In that state, the top ring 120 is lowered without actuation of the air cylinder 30 to bring a wafer W held on the lower surface of the chucking plate 142 onto the surface of the polishing pad 10. Since the top ring 120 is not pressed by the air cylinder 30, the projection 142a of the chucking plate 142 remains held in contact with the upper surface of the retainer ring 144. In that state, the housing 140 and the retainer ring 144 of the top ring 120 are at an uppermost position with respect to the chucking plate 142. Then, the control unit 34 moves the stopper 32 and adjusts the vertical position of the stopper 32 based on a distance signal outputted from the sensor 36 so that the distance between the stopper 32 and the bracket 28, which is detected by the sensor 36, is equal to a predetermined distance $H_0$ (see FIG. 6). The adjusted position of the stopper 32 determines a vertical position of the top ring 120 at the time of polishing. The adjusted position of the stopper 32 is stored in a storage device within the control unit 34.

Figure 6:
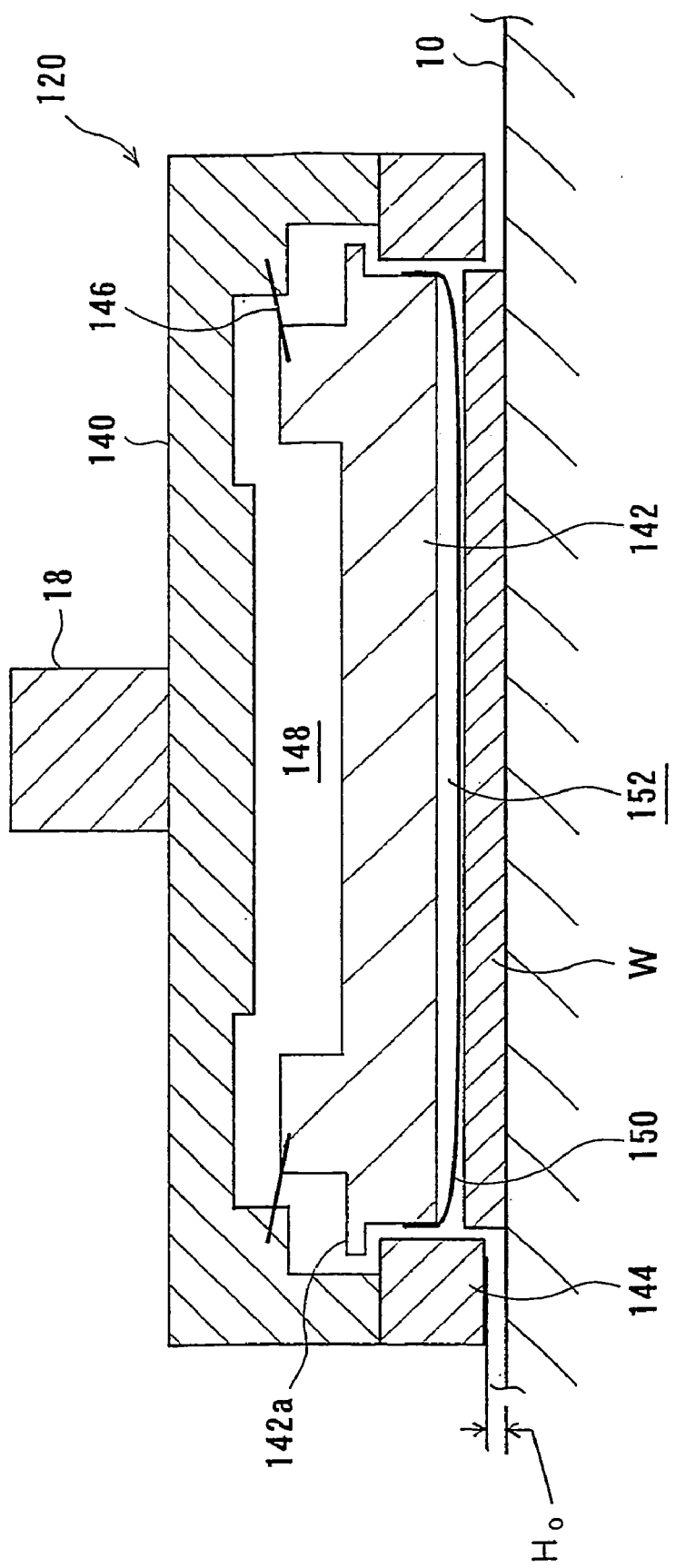
FIG. 6 is a schematic view showing a state of the top ring shown in FIG. 5 when a wafer is polished.

When a wafer is polished, the air cylinder 30 is actuated to lower the top ring 120 until the bracket 28 is brought into contact with the stopper 32. FIG. 6 shows this state of the top ring 120. As shown in FIG. 6, the wafer can be polished in a state in which the retainer ring 144 is located at the predetermined height $H_0$ from the polishing pad 10. Specifically, the wafer can be polished in a state in which the retainer ring 144 is above the polishing pad 10 to prevent abrasion of the polishing pad 10 which would otherwise be caused by the retainer ring 144.

In the above embodiments, the upper surface of the polishing pad 10 serves as the polishing surface which is brought into sliding contact with the semiconductor wafer W. However, the polishing surface is not limited to the upper surface of the polishing pad. For example, the polishing surface may be constituted by a fixed abrasive. The fixed abrasive is formed into a flat plate comprising abrasive particles fixed by a binder. With the fixed abrasive for polishing, the polishing process is performed by abrasive particles that are self-generated from the fixed abrasive. The fixed abrasive comprises abrasive particles, a binder, and pores. For example, cerium dioxide ($CeO_2$) having an average particle diameter of 0.5 µm or less is used as an abrasive particle, and epoxy resin is used as a binder. Such a fixed abrasive forms a harder polishing surface. The fixed abrasive includes a fixed abrasive pad having a two-layer structure formed by a thin layer of a fixed abrasive and an elastic polishing pad attached to a lower surface of the thin layer of the fixed abrasive.

The present invention is suitable for use in a polishing apparatus for polishing a workpiece such as a semiconductor wafer to a flat mirror finish. Although certain preferred embodiments of the present invention have been shown and described in detail, it should be understood that various changes and modifications may be made therein without departing from the scope of the appended claims.

The invention claimed is:

1. A polishing apparatus comprising:
    a polishing table having a polishing surface thereon;
    a top ring for pressing a workpiece against said polishing surface, said top ring having a retainer ring for holding an outer circumferential edge of the workpiece and a chucking plate to hold the workpiece on a lower surface thereof;
    a vertically moving mechanism operable to vertically move said top ring;
    a bracket vertically movable together with said top ring;
    a stopper adjustable in vertical position to prevent downward movement of said bracket;
    a sensor for detecting a distance between said stopper and said bracket; and
    a control unit operable to adjust said stopper in vertical position when the workpiece held on the lower surface of said chucking plate is brought into contact with said polishing surface while a lower surface of said retainer ring of said top ring is located at a predetermined height from said polishing surface so that the distance between said stopper and said bracket is equal to a difference between a height of the lower surface of said retainer ring from said polishing surface at the time of polishing and said predetermined height.

2. The polishing apparatus according to claim 1, wherein the chucking plate has a membrane for pressing the workpiece against the polishing surface on a lower surface thereof.

3. The polishing apparatus according to claim 1, wherein the chucking plate is vertically movable.

4. The polishing apparatus according to claim 3, wherein the predetermined height is defined as a height of said retainer ring above said polishing surface when said retainer ring is moved to an uppermost position with respect to said chucking plate.

5. A polishing apparatus comprising:

a polishing table having a polishing surface thereon;

a top ring for pressing a workpiece against said polishing surface, said top ring having a retainer ring for holding an outer circumferential edge of the workpiece and a chucking plate to hold the workpiece on a lower surface thereof;

a vertically moving mechanism operable to vertically move said top ring;

a bracket vertically movable together with said top ring;

a stopper adjustable in vertical position to prevent downward movement of said bracket;

a sensor for detecting a distance between said stopper and said bracket; and a control unit operable to adjust said stopper in vertical position based on a distance signal from said sensor.

* * * * *